United States Patent
Bauwelinck et al.

(10) Patent No.: US 9,432,225 B2
(45) Date of Patent: Aug. 30, 2016

(54) TEST CIRCUITS

(71) Applicants: IMEC VZW, Leuven (BE); Universiteit Gent, Ghent (BE)

(72) Inventors: Johan Bauwelinck, Temse (BE); Guy Torfs, Ghent (BE); Yu Ban, Ghent (BE); Timothy De Keulenaer, Ghent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 4 days.

(21) Appl. No.: 14/668,415

(22) Filed: Mar. 25, 2015

(65) Prior Publication Data
US 2015/0276873 A1    Oct. 1, 2015

(30) Foreign Application Priority Data

Mar. 26, 2014  (EP) .................................... 14161772

(51) Int. Cl.
*H04L 25/03*    (2006.01)
*G01R 31/3181*    (2006.01)
(Continued)

(52) U.S. Cl.
CPC ..... *H04L 25/03891* (2013.01); *G01R 31/3181* (2013.01); *H04L 25/03057* (2013.01); *H04L 25/03133* (2013.01); *H04L 25/03878* (2013.01); *H04L 25/03019* (2013.01); *H04L 25/03038* (2013.01); *H04L 2025/0349* (2013.01); *H04N 7/26127* (2013.01); *H04N 7/26132* (2013.01); *H04N 7/26244* (2013.01); *H04N 7/50* (2013.01)

(58) Field of Classification Search
CPC .................. H04L 25/03057; H04L 25/03038; H04L 25/03019; H04L 25/03133; H04L 2025/0349; H04L 25/03891; H04L 25/03878; H04N 7/50; H04N 7/26244; H04N 7/26127; H04N 7/26132; G01R 31/3181

USPC ........................ 375/229–233, 240.02–240.06
See application file for complete search history.

(56) References Cited

U.S. PATENT DOCUMENTS 7,346,645 B2 *  3/2008  Reynolds ............... H03H 15/02
                                                             708/819
7,952,376 B1     5/2011  Yu Kasnavi et al.
(Continued)

FOREIGN PATENT DOCUMENTS

JP        H11288600 A     10/1999

OTHER PUBLICATIONS

European Search Report, European Patent Application No. 14161772.0, dated Sep. 3, 2014.
(Continued)

*Primary Examiner* — Sam K Ahn
*Assistant Examiner* — Janice Tieu
(74) *Attorney, Agent, or Firm* — McDonnell Boehnen Hulbert & Berghoff LLP (57) ABSTRACT

Described herein is a feed forward equalizer that is configured to operate in a normal operational mode and in a test operational mode. The feed forward equalizer has an input port and an output port which are used for the normal operational mode. A test input port and a test output port are provided in the feed forward equalizer, and are used for the test operational mode. Buffers may be provided for matching the impedance of respective ones of the input, output, test input, and test output ports. The feed forward equalizer allows testing during development, and once mounted in an integrated circuit, without interfering with the normal operational mode.

13 Claims, 4 Drawing Sheets

(51) Int. Cl.
*H04N 19/176* (2014.01)
*H04N 19/61* (2014.01)
*H04N 19/136* (2014.01)
*H04N 19/137* (2014.01)

(56) References Cited

U.S. PATENT DOCUMENTS

2004/0136731 A1* 7/2004 Wang .................. H04B 10/6971
398/208
2007/0133671 A1* 6/2007 Tsai ....................... H03H 11/26
375/233
2007/0182481 A1* 8/2007 Wu .......................... H03F 3/602
330/54
2009/0185609 A1 7/2009 Takada

OTHER PUBLICATIONS

Lin, Mitchell et al., "Testable Design for Advanced Serial-Link Transceivers," Proc. IEEE Design, Automation and Test in Europe (2007) 6 pages.

Momtaz, Afshin et al., "An 80 mW 40 Gb/s 7-Tap T/2-Spaced Feed-Forward Equalizer in 65 nm CMOS," IEEE Journal of Solid-State Circuits, vol. 45, No. 3, Mar. 2010, pp. 629-639.

Sewter, Jonathan et al., "A CMOS Finite Impulse Response Filter With a Crossover Traveling Wave Topology for Equalization up to 30 Gb/s," IEEE Journal of Solid-State Circuits, vol. 41, No. 4, Apr. 2006, pp. 909-917.

* cited by examiner

TEST CIRCUITS

CROSS-REFERENCE TO RELATED APPLICATION

This application claims priority to European Patent Application No. 14161772.0 filed on Mar. 26, 2014, the contents of which are hereby incorporated by reference.

TECHNICAL FIELD

The present disclosure relates to electronic circuits and, more specifically, is related to an improvement for testing electronic circuits.

BACKGROUND

The demand for higher data rates in electronic circuits is permanent. If the data rate of a signal is higher than the bandwidth of a channel used by the signal, the signal integrity can degrade, generating unwanted phenomena like reduced-eye opening, jitter, inter-symbol interference, etc.

Such limitations due to a channel can be overcome with an equalizer located between a signal source and the channel. For example, when a data source sends a signal to an equalizer, the equalizer can introduce predistortion in the signal such that the signal output from a channel located after the equalizer is essentially unchanged with respect to the signal output from the data source. In other words, the equalizer acts as a filter that implements the inverse characteristic of the channel so that the usable frequency range is extended for high data rate signals. At high frequency, the equalizer may be a Feed-Forward Equalizer (FFE), or, more specifically, a travelling-wave type FFE.

A problem may occur when the FFE or its functionality need to be tested, for example, when the gain of variable gain amplifiers of the FFE have to be determined, during the development phase of a product including a FFE, or during the tests following the circuit production. In a practical system, the FFE may be soldered between other circuit components on a Printed Circuit Board (PCB). As such, it may not be possible to test the FFE individually without disconnecting the FFE from the PCB or without inserting test multiplexers that degrade the signal quality, especially at high frequencies.

The FFE may also be integrated in the same integrated circuit as other electronic building blocks, and therefore it becomes difficult to test the FFE individually. Adding test ports next to the conventional input and output ports generally disturbs high-frequency signals because extra circuitry is required on the high speed data path to allow either an internal data signal or an external test signal to be connected to the FFE input and output. This extra circuitry introduces extra power consumption and additional parasitics that degrade the signal quality and bandwidth of the data path.

This problem is acknowledge in the paper "Testable Design for Advanced Serial-Link Transceivers," where Mitchell Lin and Kwang-Ting Cheng describe a design to characterize a Decision-Feedback Equalizer (DFE). This design modifies the conventional DFE topology by using flip-flops.

SUMMARY

The present disclosure may provide a feed forward equalizer that can be tested individually even when associated with other electronic building blocks. The present disclosure may also provide a feed forward equalizer that can be tested using the same components as those used for normal operation.

In accordance with one aspect of the present disclosure, there is provided a feed forward equalizer circuit that includes an input port for receiving an input signal, a first line connected to the input port, an output port for providing an output signal, and a second line connected to the output port. In this aspect, the feed forward equalizer circuit also includes a first tap element connected between the first line and the second line at respective line nodes, at least one second tap element connected between the first line and the second at respective line nodes, at least one first delay element connected to the first line between the first tap element and the at least one second tap element, and at least one second delay element connected to the second line between the at least one second tap element and the first tap element. The feed forward equalizer circuit may further comprise a test input port connected to the first line and a test output port connected to the second line. The test input port and the test output port may be respectively connected to first and second line nodes associated with the at least one second tap element.

By having a test input port and test output port located in a separate location to the input port and the output port, it is possible to test the elements of the feed forward equalizer circuit irrespective of where it is mounted without interfering with other electronic components of a circuit of which the feed forward equalizer circuit forms a part.

In one embodiment, the at least one second tap element comprises a plurality of second tap elements including a first second tap element and a last second tap element, the test input port and test output port being connected respectively to the first and second line nodes associated with the last second tap element.

At least one further test input port and at least one further test output port may be provided, and which are arranged for testing at least one second tap element.

In another embodiment, each second tap element is spaced from adjacent second tap elements by respective ones of first and second delay elements.

An input buffer may be associated with the input port and an output buffer may be associated with the output port. In one example, the input and output buffers are impedance matched with respective ones of the input and output ports.

Additionally, a test input buffer may be associated with the test input port and a test output buffer may be associated with the test output port. In one example, the test input and test output buffers are impedance matched to respective ones of the test input and test output ports.

In one embodiment, each input buffer and each output buffer includes a current source, each current source being enabled for operation of the respective buffer.

In accordance with another aspect of the present disclosure, there is provided an integrated circuit including a feed forward equalizer circuit as described above.

In accordance with a further aspect of the present disclosure, there is provided a method of testing a feed forward equalizer circuit comprising an input port for receiving an input signal; a first line connected to the input port; an output port for providing an output signal; a second line connected to the output port; a first tap element connected between the first line and the second line at respective line nodes; at least one second tap element connected between the first line and the second line at respective line nodes; at least one first delay element connected to the first line between the first tap element and the at least one second tap element; and at least one second delay element connected to the second line between the at least one second tap element and the first tap; wherein the feed forward equalizer circuit further comprises a test input port connected to the first line and a test output port connected to the second line; and the test input port and the test output port are respectively connected to first and second line nodes associated with the at least one second tap element. In this aspect, the method includes disabling the input port and the output port, introducing a test input signal at the test input port, and measuring a test output signal at the test output port. Further, introducing the test input signal at the test input port may include introducing the test input signal into the feed forward equalizer circuit at the first line node associated with the at least one second tap element during testing.

In one embodiment, the method further includes adjusting parameters of each tap element in accordance with the measured test output signal at the test output port.

In another embodiment, the method further comprises connecting the test output port to a channel and checking the output from the channel for coherency with the input signal introduced into the test input port.

DESCRIPTION OF THE DRAWINGS

For a better understanding of the present disclosure, reference will now be made, by way of example, to the accompanying drawings in which.

DETAILED DESCRIPTION

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

In an embodiment of the present disclosure, the electrical signal is a differential electrical signal. However, it will be appreciated that the present disclosure is not limited to differential electrical signals.

The term "high frequency" as used herein is intended to mean a frequency that is higher than one fifth of the transition frequency $f_T$. Typically, high frequency as used herein refers to frequencies higher than 10 GHz, such as frequencies higher than 40 GHz, for instance.

The present disclosure describes a travelling-wave type feed-forward equalizer (FFE) including test ports such that the FFE characteristics can be fully tested in linear and non-linear regimes.

The operation of a conventional FFE is described with reference to FIG. 1. A data source 101 generates an output signal 102 which forms an input of a FFE 103. The FFE 103 generates an output signal 104 which forms an input for a channel 105. The channel 105 generates a signal 106. The FFE 103 introduces predistortion into the signal 104 such that the output signal 106 from channel 105 located after the FFE 103 is essentially unchanged with respect to the output signal 102 from the data source 101. In one example, the data source 101 is a multiplexer or a serializer and the channel 105 is a metal line on a printed circuit board (PCB).

The signal 102 out of the data source may have a non-return-to-zero (NRZ) modulation scheme and the settings of the FFE 103 may be chosen such that the signal 106 coming out of the channel 105 has also an NRZ modulation scheme. Alternatively, the signal 102 out of the data source may have a non-return-to-zero (NRZ) modulation scheme and the settings of the FFE 103 may be chosen such that the signal 106 coming out of the channel 105 has duobinary modulation scheme.

Figure 2A:
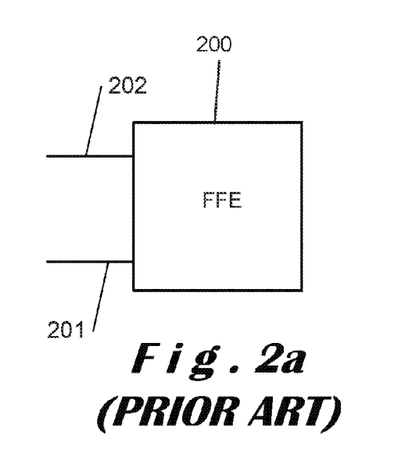
FIG. 2a illustrates a feed-forward equalizer according to the state-of-art.
Figure 2B:
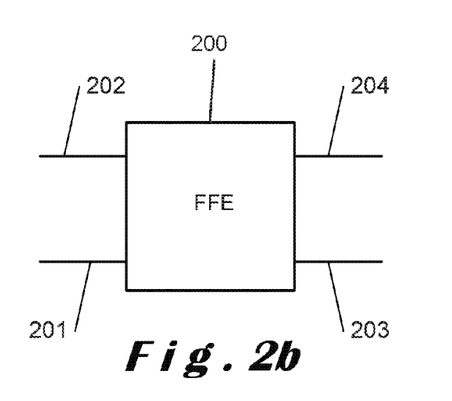
FIG. 2b illustrates a feed-forward equalizer according to an embodiment of the present disclosure.

FIGS. 2a and 2b schematically represent the basic principle of operation of the prior art and the present disclosure, respectively. FIG. 2a shows a conventional FFE 200 with an input port 201 and an output port 202. FIG. 2b shows the FFE 200 with the input port 201, the output port 202, a test input port 203, and a test output port 204.

Figure 3:
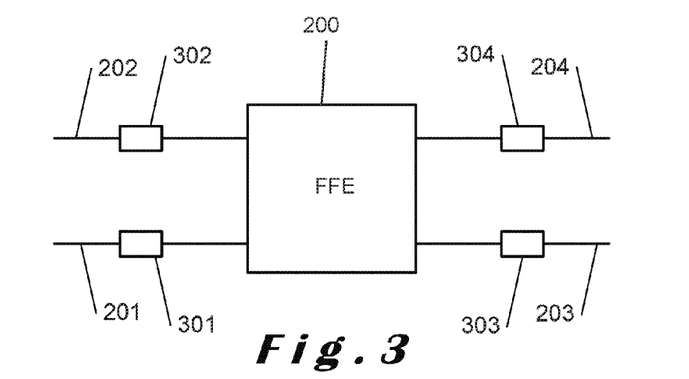
FIG. 3 illustrates a feed-forward equalizer according to an embodiment of the present disclosure.

As shown in FIG. 3, the input port 201 can be connected to the FFE 200 through an input buffer 301. The output port 202 can be connected to the FFE 200 through an output buffer 302. The test input port 203 can be connected to the FFE 200 through a test input buffer 303. The test output port 204 can be connected to the FFE 200 through a test output buffer 304.

In the present example, the input buffer 301 matches the impedance of the element connected to the input of the FFE 200 with the input impedance of the FFE 200. The output buffer 302 matches the impedance of the element connected to the output of the FFE 200 with the output impedance of the FFE 200. The test input buffer 303 matches the impedance of the element connected to the test input of the FFE 200 with the impedance of the test input of FFE 200. The test output buffer 304 matches the impedance of the element connected to the test output of the FFE 200 with the impedance of the test output of FFE 200.

Figure 4:
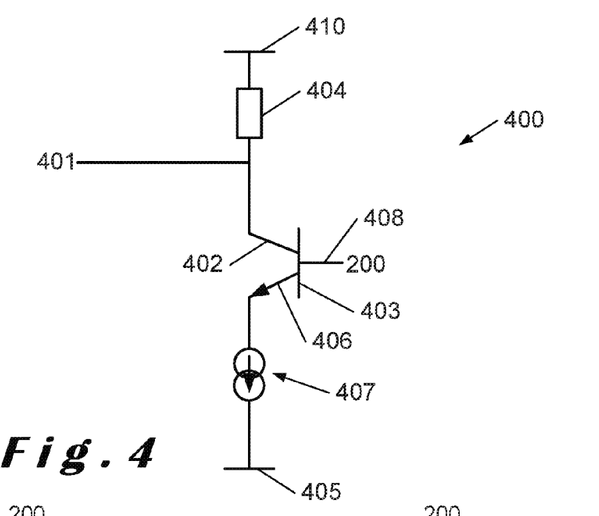
FIG. 4 illustrates a buffer circuit used in embodiments of the present disclosure.

An implementation of a buffer circuit 400 is shown on FIG. 4. A channel or an external circuit (not shown) is connected by an electrical connection 401 to a collector 402 of a NPN bipolar transistor 403 and to a load resistance 404. The other side of the load resistance 404 is connected to a voltage supply 410. An emitter 406 of the NPN bipolar transistor 403 is connected to a current source 407. The other side of the current source 407 is connected to ground 405. A base 408 of the NPN bipolar transistor 403 is connected to the FFE 200. The buffer circuit 400 like that shown in FIG. 4 can be used for the output buffer 302 and/or the test output buffer 304. For the input buffer 301 and the test input buffer 303, the FFE input or test input port is connected to the electrical connection 401 and the base 408 of the NPN bipolar transistor 403 is connected to the data source or an external circuit.

In an embodiment of the present disclosure, the test input port is a pad or a set of pads on the integrated circuit through which electrical contact can be made, for example, by way of test needles or bond wires. In an embodiment of the present disclosure, the test output port is a pad or a set of pads on the integrated circuit through which electrical contact can be made, for example, by way of test needles or bond wires. In an embodiment of the present disclosure, a set of pads comprises three or four pads as usual for high-frequency signals, but it will be appreciated that the present disclosure is not limited to this number and can be any suitable number according to the particular application.

Figures 5A, 5B:
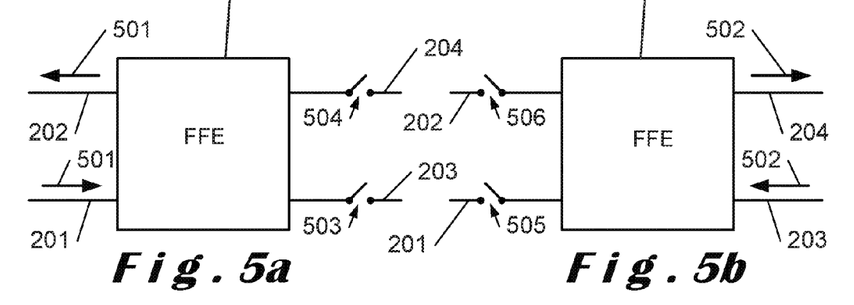
FIGS. 5a and 5b respectively illustrate one of two modes of operation of a feed-forward equalizer according to an embodiment of the present disclosure.

The FFE 200 described in the present disclosure has two modes of operations schematically represented on FIGS. 5a and 5b. In a normal mode of operation, shown on FIG. 5a, the signal 501 enters the FFE 200 by the input port 201 and leaves the FFE 200 by the output port 202. In this mode of operation, the test input port 203 and test output port 204 are disconnected by means of disconnection elements or circuits 503 and 504. In an embodiment of the present disclosure where the test input buffer 203 and test output buffer 204 are implemented by the buffer circuit 400 of FIG. 4, the test input port 203 and test output port 204 are disconnected by switching off the current source 407. The test input port 203 and test output port 204 do not disturb the signal 501 during the normal mode of operation.

In a test mode of operation, shown on FIG. 5b, the signal 502 enters the FFE 200 by the test input port 203 and leaves the FFE 200 by the test output port 204. During the test mode of operation, the input port 201 and output port 202 are disconnected by means of disconnection elements or circuits 505 and 506. In an embodiment of the present disclosure where the input buffer 201 and output buffer 202 are implemented by the buffer circuit 400 of FIG. 4, the input port 201 and output port 202 are disconnected by switching off the current source 407. The input port 201 and output port 202 do not disturb the test signal 502 during the test mode of operation.

During the normal mode of operation, the signal 501 is not disturbed by the test input port 203 or by electrical circuits connected to it, or by the test output port 204 or by electrical circuits connected to it.

During the test mode of operation, the signal 502 is not disturbed by the input port 201 or by electrical circuits connected to it like the data source 101, or by the output port 202 or by electrical circuits connected to it like the channel 105.

Figure 6:
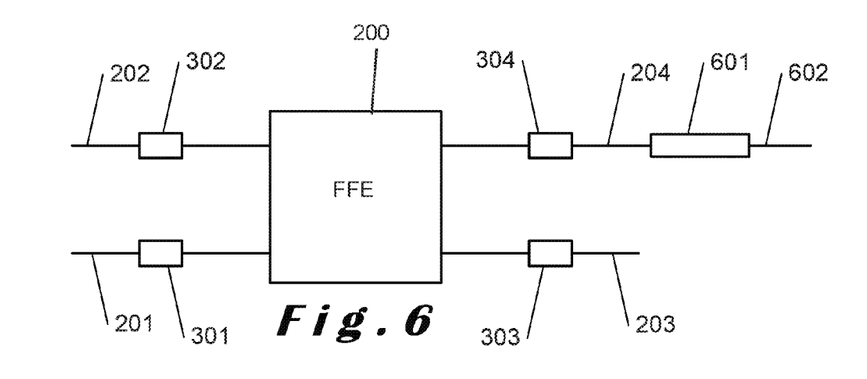
FIG. 6 illustrates a feed-forward equalizer and a test channel according to an embodiment of the present disclosure.

In an embodiment of the present disclosure, as shown in FIG. 6, the test output port 204 is electrically connected to a test channel 601, the test channel 601 being connected to a channel test output port 602. The test channel 601 may comprise a metal line on a PCB. In an embodiment of the present disclosure, the channel test output port 602 is a pad or a set of pads through which electrical contact can be made, for example, by way of test needles or bond wires.

Figure 7:
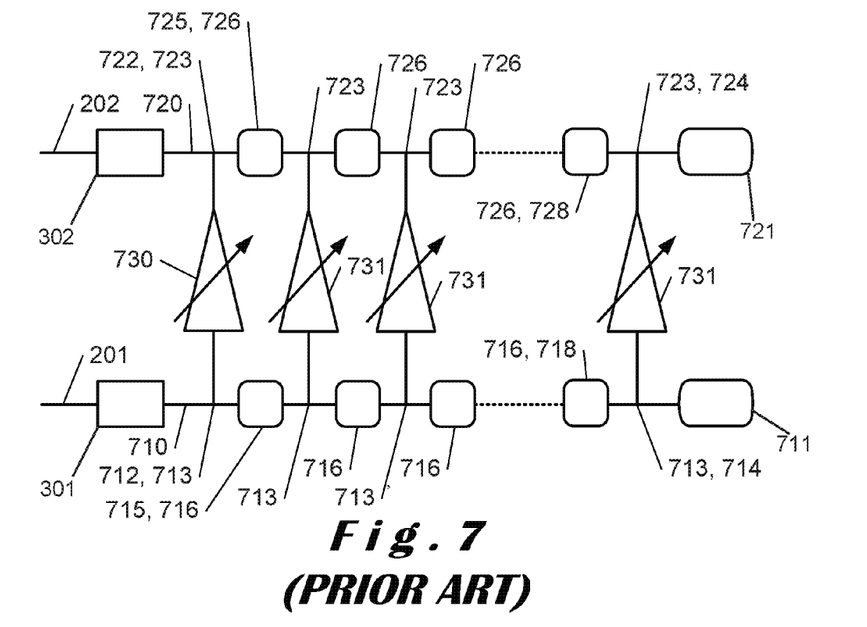
FIG. 7 illustrates a block diagram of a feed-forward equalizer according to the state-of-art.

A state of the art travelling-wave FFE 200 is shown on FIG. 7 and illustrates an implementation of the FFE shown in FIG. 2a. The travelling-wave FFE 200 includes a first line 710 and a second line 720. The first line 710 extends between input port 201 and a first termination element 711. The first line 710 also connects: the input port 201 to the input buffer 301; the input buffer 301 to a first node 712; and the first node 712 to a first delay element 715, the first delay element 715 forming one of a first set of delay elements 716.

The first line 710 connects in series a plurality of delay elements of the first set of delay elements 716. The first termination element 711 comprises a resistor, for example. The delay elements of the first set of delay elements 716 may be identical transmission lines. However, it will be appreciated that other forms of delay elements can be used.

A plurality of electrical nodes 713 is present on the first line 710 between the input buffer 301 and the first delay element 715 of the first set of delay elements 716; between the delay elements of the first set of delay elements 716; and between a last delay element 718 of the first set of delay elements 716 and the first termination element 711.

The second line 720 extends between output port 202 and a second termination element 721. The second line 720 also connects: the output port 202 to the output buffer 302; the output buffer 302 to a first node 722; and the first node 722 to a first delay element 725, the first delay element 725 forming one of a second set of delay elements 726. The second line 720 connects in series a plurality of delay elements of the second set of delay elements 726. The second termination element 721 is a resistor, for example. The delay elements of the second set of delay elements 726 may be identical transmission lines. However, it will be appreciated that other forms of delay elements can be used.

A plurality of electrical nodes 723 is present on the second line 720 between the output buffer 302 and the first delay element 725 of the second set of delay elements 726; between the delay elements of the second set of delay elements 726; and between a last delay element 728 of the second set of delay elements 726 and the second termination element 721.

A first variable gain amplifier 730 is connected between the first node 712 on the first line 710 and the first node 722 on the second line 720. A plurality of second variable gain amplifiers 731 is connected between nodes 713 on the first line 710 and nodes 723 on the second line 720, with the first line 710 connecting the input of the first variable gain amplifier 730 and the inputs of the variable gain amplifiers 731 with a delay element of the first set of delay elements 716 between each input, and the second line 720 connecting the output of the first variable gain amplifier 730 and the outputs of the variable gain amplifiers 731 with a delay element of the second set of delay elements 726 between each output.

In this embodiment, the first and second variable gain amplifiers 730, 731 form tap elements which are connectable within the FFE in accordance with the signal to be equalized.

In an embodiment of the present disclosure, the FFE includes only two variable gain amplifiers (one first variable gain amplifier 730 and one second variable gain amplifier 731) with only one delay element 715 in the first line 710 and only one delay element 725 in the second line 720 between the two amplifiers.

Additionally, it is not necessary that each of the delay elements implements an identical delay, and each delay element may implement a different delay to other delay elements. However, by having identical delays, a symmetrical FFE is obtained, for example, if the first delay element 715 on the first line 710 has the same delay as the last delay element 718 on the first line 710, etc.

The $i^{th}$ delay element of the first set of delay elements 716 creates a time delay $D_{1,i}$ between the input signals of two neighbouring variable gain amplifiers 730 or 731. The $i^{th}$ delay element of the second set of delay elements 726 creates a time delay $D_{2,i}$ between the output signals of two neighbouring variable gain amplifiers 730 or 731.

If the signal passing through the first node 712 on the first line 710 is X(t) at the time t, the signal passing through the first node 722 on the second line 720 at the time t is $$Y(t)=\Sigma_{i=0}^{n}\{A_i X[t-\Sigma_{j=0}^{i}(D_{1,j}+D_{2,i})]\}$$  (Equation 1)

In Equation 1, $A_0$ is the gain of the variable gain amplifier 730, $A_i$ (with $i \geq 1$) is the gain of the $i^{th}$ variable gain amplifier 731, and n corresponds to the number of delay elements in each set of delay elements 713, 723 and to the number of variable gain amplifiers 731. $D_{1,n}$ and $D_{2,n}$ thus correspond to respective ones of the delays of the last delay elements 718, 728, and $A_n$ corresponds to the gain of the last variable gain amplifier connected at nodes 714 and 724.

The FFE could be used in normal mode with the test input port instead of the input port and the test output port instead of the output port because it is symmetrical. The difference between the test input port and the input port is in the elements outside the FFE and connected to the FFE. Similarly, the difference between the test output port and the output port is in the elements outside the FFE and connected to the FFE. However, this symmetry may only obtained in the case where the delay elements are symmetrical, with the first delay element 715 on the first line 710 giving the same delay as the last delay element 718 on the first line 710, etc.

Figure 8:
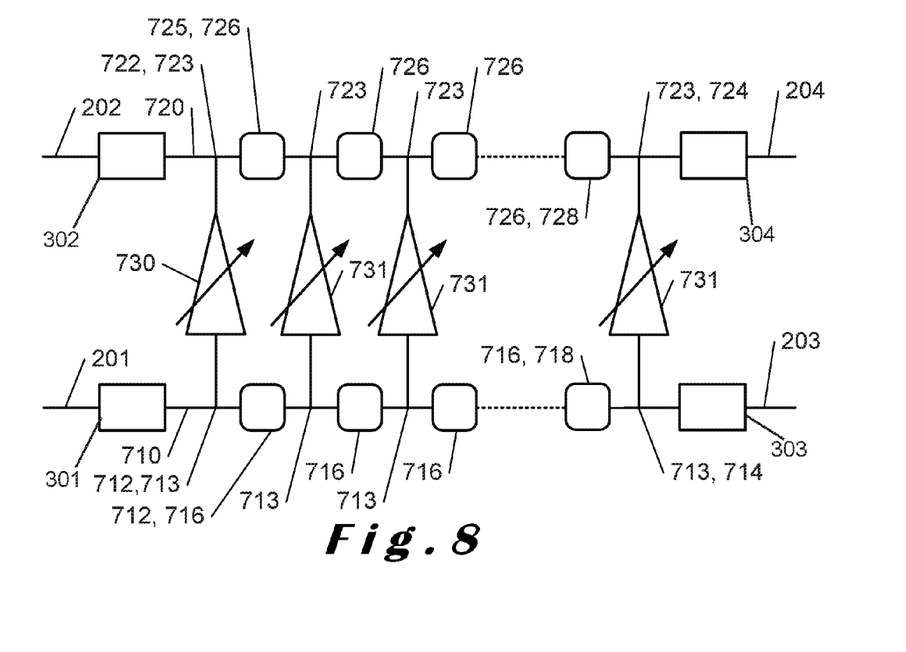
FIG. 8 illustrates a block diagram of a feed-forward equalizer according to an embodiment of the present disclosure.

An embodiment of the present disclosure can be described using FIG. 8. Identical elements in FIGS. 7 and 8 are numbered the same and will not be described again in detail when describing FIG. 8. Compared to the state of the art FFE shown on FIG. 7, the first termination element 711 is replaced by the test input buffer 303 and the test input port 203, and the second termination element 721 is replaced by the test output buffer 304 and the test output port 204.

The last variable gain amplifier of the normal mode of operation becomes the first variable gain amplifier of the test mode of operation. In general, in a FFE comprising M variable gain amplifiers, the $(M+1-i)^{th}$ variable gain amplifier of the normal mode of operation becomes the $i^{th}$ variable gain amplifier of the test mode of operation. In an embodiment of the present disclosure, the value of the gain determined for the $(M+1-i)^{th}$ variable gain amplifier in the test mode of operation is later used for the gain of the $i^{th}$ variable gain amplifier during normal mode of operation.

Figure 1:
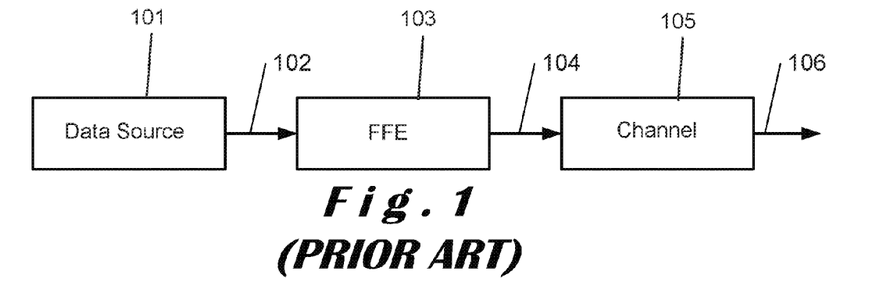
FIG. 1 illustrates the signal path in a circuit according to the state-of-art.
Figure 9:
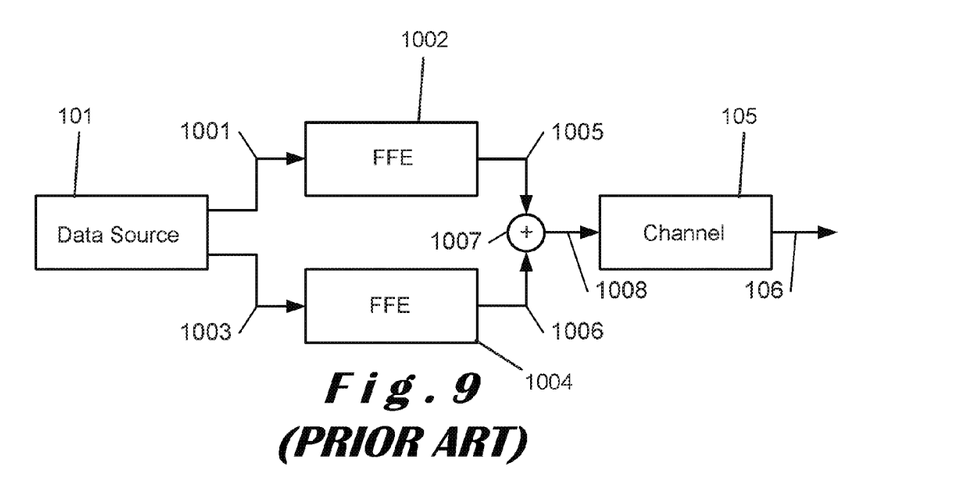
FIG. 9 illustrates the signal path in another circuit according to the state-of-art.

If the FFE 103 of FIG. 1 is replaced by two equalizers in parallel, as shown on FIG. 9, the settings of the equalizers can be chosen such that the signal 106 coming out of the channel 105 has a 4-level phase-amplitude modulation scheme (PAM-4). In FIG. 9, the data source 101 generates a first signal 1001 and a second signal 1003 as outputs. The first signal 1001 is an input to a first FFE 1002. The second signal 1003 is an input to a second FFE 1004. The first FFE 1002 generates as output a signal 1005. The second FFE 1004 generates as output a signal 1006. The signals 1005 and 1006 are inputs of an adder 1007. The adder 1007 generates as output a signal 1008. The signal 1008 is an input in the channel 105.

In an embodiment of the present disclosure, the first signal 1001 is the Most Significant Bit of an NRZ. The second signal 1003 is the Least Significant Bit of an NRZ. The predistortion created by the first FFE 1002 and the second FFE 1004 is such that the signal 106 coming out of the channel 105 has a PAM-4 modulation scheme.

Figure 10:
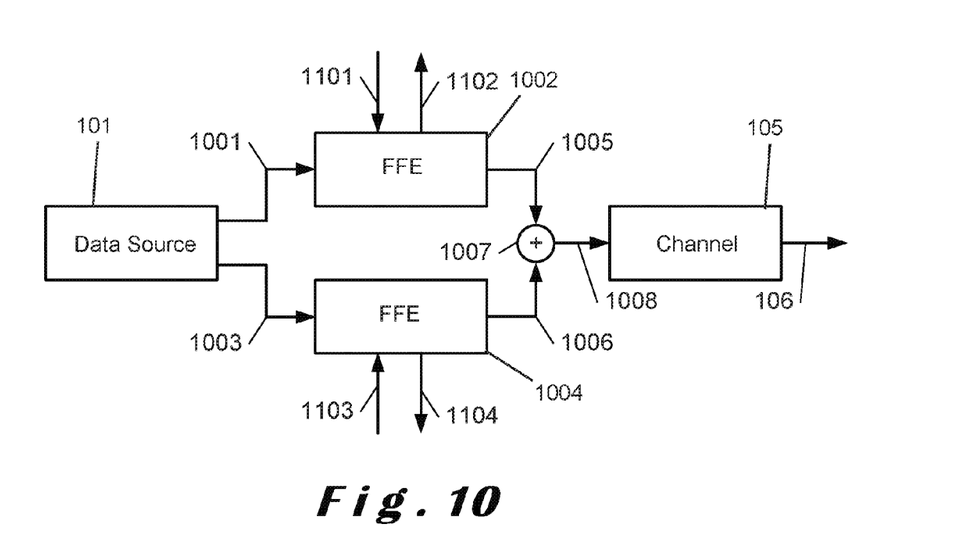
FIG. 10 illustrates a circuit according to an embodiment of the present disclosure.

In an embodiment of the disclosure, if the predistortion is created by several FFEs, as in the case of FIG. 9, each of the FFEs has a test input port and a test output port. For example, on FIG. 10, the first FFE 1002 has a test input port 1101 and a test output port 1102 and the second FFE 1004 has a test input port 1103 and a test output port 1104.

Although the present disclosure has been described with reference to specific embodiments, it will be appreciated that other embodiments are also possible when implementing a test circuit for FFE.

The invention claimed is:

1. A feed forward equalizer circuit comprising:
   an input port for receiving an input signal;
   a first line connected to the input port;
   an output port for providing an output signal;
   a second line connected to the output port;
   a first tap element connected between the first line and the second line at respective line nodes;
   at least one second tap element connected between the first line and the second line at respective line nodes;
   at least one first delay element connected to the first line between the first tap element and the at least one second tap element;
   at least one second delay element connected to the second line between the at least one second tap element and the first tap element;
   a test input port connected to the first line and a test output port connected to the second line, and wherein the test input port and the test output port are respectively connected to first and second line nodes associated with the at least one second tap element.

2. The feed forward equalizer circuit according to claim 1, wherein the at least one second tap element comprises a plurality of second tap elements including a first second tap element and a last second tap element, the test input port and test output port being connected respectively to the first and second line nodes associated with the last second tap element.

3. The feed forward equalizer circuit according to claim 2, wherein the test input port includes a first set of pads through which electrical contact can be made, and wherein the test output port includes a second set of pads through which electrical contact can be made.

4. The feed forward equalizer circuit according to claim 1, wherein each second tap element is spaced from adjacent second tap elements by respective ones of first and second delay elements.

5. The feed forward equalizer circuit according to claim 1, further comprising an input buffer associated with the input port, and an output buffer associated with the output port.

6. The feed forward equalizer circuit according to claim 5, wherein the input buffer and the output buffer are impedance matched to the input port and the output port, respectively.

7. The feed forward equalizer circuit according to claim 5, further comprising a test input buffer associated with the test input port, and a test output buffer associated with the test output port.

8. The feed forward equalizer circuit according to claim 7, wherein the test input buffer and the test output buffer are impedance matched to the test input port and the test output port, respectively.

9. The feed forward equalizer circuit according to claim 8, wherein each input buffer and each output buffer includes a current source, each current source being enabled for operation of the respective buffer.

10. An integrated circuit including a feed forward equalizer circuit, wherein the feed forward equalizer circuit comprises:
    an input port for receiving an input signal;
    a first line connected to the input port;
    an output port for providing an output signal;
    a second line connected to the output port;

a first tap element connected between the first line and the second line at respective line nodes;

at least one second tap element connected between the first line and the second line at respective line nodes;

at least one first delay element connected to the first line between the first tap element and the at least one second tap element;

at least one second delay element connected to the second line between the at least one second tap element and the first tap element;

a test input port connected to the first line and a test output port connected to the second line, and wherein the test input port and the test output port are respectively connected to first and second line nodes associated with the at least one second tap element.

11. A method of testing a feed forward equalizer circuit comprising an input port for receiving an input signal; a first line connected to the input port; an output port for providing an output signal; a second line connected to the output port; a first tap element connected between the first line and the second line at respective line nodes; at least one second tap element connected between the first line and the second line at respective line nodes; at least one first delay element connected to the first line between the first tap element and the at least one second tap element; and at least one second delay element connected to the second line between the at least one second tap element and the first tap element; wherein the feed forward equalizer circuit further comprises a test input port connected to the first line and a test output port connected to the second line; and the test input port and the test output port are respectively connected to first and second line nodes associated with the at least one second tap element, the method comprising:

disabling the input port and the output port;

introducing a test input signal at the test input port into the feed forward equalizer circuit at the first line node associated with the at least one second tap element during testing; and measuring a test output signal at the test output port.

12. The method according to claim 11, further comprising adjusting parameters of each tap element in accordance with the measured test output signal at the test output port.

13. The method according to claim 12, further comprising connecting the test output port to a channel and checking the output from the channel for coherency with the input signal introduced into the test input port.

* * * * *